(12) United States Patent
You (10) Patent No.: US 9,728,738 B2
(45) Date of Patent: Aug. 8, 2017

(54) ORGANIC LIGHT-EMITTING DISPLAY APPARATUS AND METHOD OF MANUFACTURING THE SAME

(71) Applicant: Samsung Display Co., Ltd., Yongin-si, Gyeonggi-do (KR)

(72) Inventor: Chungi You, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/859,709

(22) Filed: Sep. 21, 2015

(65) Prior Publication Data

US 2016/0141544 A1    May 19, 2016

(30) Foreign Application Priority Data

Nov. 17, 2014   (KR) ........................ 10-2014-0160053

(51) Int. Cl.
*H01L 27/32*   (2006.01)
*H01L 51/52*   (2006.01)

(52) U.S. Cl.
CPC ...... *H01L 51/5218* (2013.01); *H01L 27/3248* (2013.01); *H01L 27/3258* (2013.01)

(58) Field of Classification Search
CPC ..... H01L 27/32; H01L 51/52; H01L 27/3246; H01L 27/3248; H01L 27/3258; H01L 51/5218
See application file for complete search history.

(56) References Cited

U.S. PATENT DOCUMENTS

| | | | | |
|---|---|---|---|---|
| 9,391,292 | B2 * | 7/2016 | Choi | H01L 51/5237 |
| 2004/0263072 | A1 * | 12/2004 | Park | H01L 27/3246 313/509 |
| 2010/0001287 | A1 | 1/2010 | Ahn et al. | |
| 2013/0175533 | A1 | 7/2013 | Lee et al. | |
| 2014/0166997 | A1 * | 6/2014 | Kim | H01L 27/1248 257/40 |
| 2014/0167000 | A1 * | 6/2014 | Jeon | H01L 27/3248 257/40 |
| 2014/0353644 | A1 * | 12/2014 | You | H01L 27/3258 257/40 |

FOREIGN PATENT DOCUMENTS

KR   10-2013-0080642 A   7/2013

* cited by examiner

*Primary Examiner* — Phuc Dang
(74) *Attorney, Agent, or Firm* — Knobbe Martens Olson & Bear LLP (57) ABSTRACT

An organic light-emitting display apparatus includes a substrate, and a thin-film transistor and a capacitor formed over the substrate. The apparatus further includes an interlayer insulation layer, a first organic insulating layer and a second organic insulation layer sequentially stacked over the substrate and covering the thin-film transistor and a capacitor. The first organic insulation layer includes a first hole that does not overlap with the thin-film transistor and the capacitor when viewed in a direction perpendicular to a major surface of the substrate. The apparatus further includes a pixel electrode formed over the interlayer insulating layer and the first organic insulating layer. The pixel electrode includes a first portion disposed inside the first hole and a second portion disposed over the first organic insulating layer and outside the first hole. The apparatus includes a light emission layer and an opposite layer formed over the pixel electrode.

19 Claims, 6 Drawing Sheets

ORGANIC LIGHT-EMITTING DISPLAY APPARATUS AND METHOD OF MANUFACTURING THE SAME

RELATED APPLICATION

This application claims the benefit of Korean Patent Application No. 10-2014-0160053, filed on Nov. 17, 2014, in the Korean Intellectual Property Office, the disclosure of which is incorporated herein in its entirety by reference.

BACKGROUND

1. Field

One or more embodiments relate to an organic light-emitting display apparatus and a method of manufacturing the same.

2. Description of the Related Art

An organic light-emitting display apparatus is a self-emissive display apparatus including a hole injection electrode and an electron injection electrode, and an emission layer formed therebetween, in which holes injected from the hole injection electrode and electrons injected from the electron injection electrode are re-combined in the emission layer so that light is emitted therefrom. The organic light-emitting display apparatus is expected to become a next generation display apparatus due to its high quality characteristic such as low power consumption, high contrast, a fast response time, etc.

SUMMARY

One or more embodiments include an organic light-emitting display apparatus having an improved display quality, and a method of manufacturing the organic light-emitting display apparatus with reduced manufacturing costs.

Additional aspects will be set forth in part in the description which follows and, in part, will be apparent from the description, or may be learned by practice of the presented embodiments.

One aspect provides an organic light-emitting display apparatus, which comprises: a substrate comprising a major surface; an active layer formed over the substrate; a gate insulating layer formed over the active layer; a gate electrode formed over the gate insulating layer for a thin-film transistor comprising the gate electrode and the active layer; a first capacitor electrode formed over the gate insulating layer and formed of the same material as that of the gate electrode; an interlayer insulating layer formed over the gate electrode and the first capacitor electrode; a source electrode and a drain electrode formed over the interlayer insulating layer; a second capacitor electrode formed over the interlayer insulating layer and formed of the same material as that of the source electrode and the drain electrode for providing a capacitor comprising the first and second capacitor electrodes; a first organic insulating layer covering the source electrode, the drain electrode, and the second capacitor electrode, the first organic insulating layer comprising a first hole that does not overlap with any of the active layer, the gate electrode and the first and second capacitor electrodes when viewed in a viewing direction perpendicular to the major surface; a pixel electrode formed over the interlayer insulating layer and the first organic insulating layer, the pixel electrode comprising a first portion disposed inside the first hole and a second portion disposed over the first organic insulating layer and outside the first hole; a second organic insulating layer formed over the first organic insulating layer and comprising a second hole that overlaps with the first hole when viewed in the viewing direction, the second organic insulating layer covering edges of the pixel electrode; a light emission layer formed over the pixel electrode; and an opposite electrode formed over the light emission layer.

In the foregoing apparatus, the pixel electrode may be a transflective electrode, and the opposite electrode may be a reflective electrode such that the opposite electrode is more light-reflective than the pixel electrode. The pixel electrode may comprise a first transparent conductive oxide layer, a transflective metal layer, and a second transparent conductive oxide layer that are sequentially stacked. Each of the first and second transparent conductive oxide layers may comprise at least one material selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). The transflective metal layer may comprise silver (Ag) or a silver alloy.

Still in the foregoing apparatus, the first hole may have a size smaller than that of the second opening when viewed in the viewing direction. A bottom surface of the pixel electrode may contact a top surface of the interlayer insulating layer. The interlayer insulating layer may comprise a silicon oxide sub-layer and a silicon nitride sub-layers that are sequentially stacked over the substrate. The silicon oxide sub-layer may have a thickness substantially twice as that of the silicon nitride sub-layer. The apparatus may further comprise a protective layer disposed over each of the source electrode, the drain electrode, and the second capacitor electrode. The light emission layer may comprise a portion overlapping the second portion of the pixel electrode when viewed in the viewing direction. The apparatus may further comprise a pad electrode disposed over the interlayer insulating layer and formed of the same material as the source electrode and the drain electrode, wherein the pad electrode comprises a portion that does not overlap the first and second organic insulating layer when viewed in the viewing direction. The apparatus may further comprise a protective layer disposed over the pad electrode. The opposite electrode may comprise an uneven surface placed over the second organic insulating layer and configured to scatter light reaching thereto.

Another aspect provides an organic light-emitting display apparatus including a substrate, and a thin-film transistor and a capacitor formed over the substrate. The apparatus further includes an interlayer insulation layer, a first organic insulating layer and a second organic insulation layer sequentially stacked over the substrate and covering the thin-film transistor and a capacitor. The first organic insulation layer includes a first hole that does not overlap with the thin-film transistor and the capacitor when viewed in a direction perpendicular to a major surface of the substrate. The apparatus further includes a pixel electrode formed over the interlayer insulating layer and the first organic insulating layer. The pixel electrode includes a first portion disposed inside the first hole and a second portion disposed over the first organic insulating layer and outside the first hole. The apparatus includes a light emission layer and an opposite layer formed over the pixel electrode.

A further aspect provides a method of manufacturing an organic light-emitting display apparatus, which comprises: forming an active layer over a substrate; forming a gate electrode and a first capacitor electrode over a gate insulating layer formed over the substrate, the gate electrode comprising a portion disposed between the active layer and the gate electrode for providing a thin-film transistor; forming a source electrode, a drain electrode, and a second capacitor electrode over an interlayer insulating layer formed over the gate insulating layer, the interlayer insulating layer comprising a portion disposed between the first and second capacitor electrodes for providing a capacitor; forming a first organic insulating layer over the interlayer insulating layer, the source electrode and the drain electrode so as to cover the source electrode and the drain electrode, the first organic insulating layer comprising a first hole in an area that does not overlap with any of the active layer, the gate electrode and the first and second capacitor electrodes when viewed in a viewing direction perpendicular to a major surface of the substrate; forming a pixel electrode over the interlayer insulating layer and the first organic insulating layer, the pixel electrode comprising a first portion disposed inside the first hole and a second portion disposed over the first organic insulating layer and outside the first hole; forming a second organic insulating layer over the first organic insulating layer, the second organic insulating layer covering edges of the pixel electrode; forming a light emission layer over the pixel electrode; and forming an opposite electrode over the light emission layer.

In the foregoing method, forming the gate electrode and the first capacitor electrode may comprise: forming an electrically conductive material layer over the gate insulating layer; and patterning the electrically conductive material layer, thereby forming the gate electrode and the first capacitor electrode with the same electrically conductive material. Forming the source electrode, the drain electrode, and the second capacitor electrode may comprise: forming an electrically conductive material layer over the interlayer insulating layer; and patterning the electrically conductive material layer, thereby forming the source electrode, the drain electrode, and the second capacitor electrode with the same electrically conductive material. Forming the source electrode, the drain electrode, and the second capacitor electrode may further comprise forming a protective layer over the electrically conductive material layer, wherein a protective layer portion disposed over each of the source electrode and the drain electrode, and the first capacitor electrode is formed by patterning the protective layer and the electrically conductive material layer. Patterning the electrically conductive material layer may further form a pad electrode of the electrically conductive material. The pixel electrode may be formed of a transflective material, wherein the opposite electrode is formed of a reflective material, which is more light-reflective than the transflective material.

According to one or more embodiments, an organic light-emitting display apparatus includes a substrate; an active layer of a thin-film transistor formed on the substrate; a gate insulating layer formed on the active layer; a gate electrode of the thin-film transistor, which is formed on the gate insulating layer, and a first electrode of a capacitor, which is formed on a same layer as the gate electrode; an interlayer insulating layer formed on the gate electrode and the first electrode; a source electrode and a drain electrode formed on the interlayer insulating layer, and a second electrode of the capacitor, which is formed on a same layer as the source electrode and the drain electrode; a first organic insulating layer covering the source electrode, the drain electrode, and the second electrode, the first organic insulating layer comprising a first opening that is formed in an area that does not overlap with the thin-film transistor and the capacitor; a pixel electrode formed in the first opening and on the first organic insulating layer that is outside the first opening; a second organic insulating layer comprising a second opening that overlaps with the first opening and covering edges of the pixel electrode; an emission layer formed on the pixel electrode; and an opposite electrode formed on the emission layer.

The pixel electrode may be a transflective electrode, and the opposite electrode may be a reflective electrode.

The pixel electrode may be formed as a first transparent conductive oxide layer, a transflective metal layer, and a second transparent conductive oxide layer that are sequentially stacked on the substrate.

Each of the first and second transparent conductive oxide layers may include at least one material selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

The transflective metal layer may include silver (Ag) or a silver alloy.

A width of the first opening may be greater than a width of the second opening.

A bottom surface of the pixel electrode may contact a top surface of the interlayer insulating layer.

The interlayer insulating layer may have a structure in which a silicon oxide layer and a silicon nitride layer are sequentially stacked on the substrate.

A thickness of the silicon oxide layer may be twice as a thickness of the silicon nitride layer.

A protective layer may be further disposed on the source electrode, the drain electrode, and the second electrode of the capacitor.

The protective layer may include a transparent conductive oxide material.

The organic light-emitting display apparatus may further include a pad electrode disposed on a same layer as the source electrode and the drain electrode.

A protective layer may be further disposed on the pad electrode.

An uneven pattern may be formed on a surface of the second organic insulating layer.

According to one or more embodiments, a method of manufacturing an organic light-emitting display apparatus includes operations of forming an active layer of a thin-film transistor on a substrate; forming a gate electrode of the thin-film transistor and a first electrode of a capacitor on a gate insulating layer; forming a source electrode, a drain electrode, and a second electrode of the capacitor on an interlayer insulating layer; forming a first organic insulating layer so as to cover the source electrode and the drain electrode, and forming a first opening in an area of the first organic insulating layer that does not overlap with the thin-film transistor and the first electrode of the capacitor; forming a pixel electrode in the first opening and on the first organic insulating layer that is outside the first opening; forming a second organic insulating layer so as to cover edges of the pixel electrode; forming an emission layer on the pixel electrode; and forming an opposite electrode on the emission layer.

The method may further include an operation of simultaneously forming a protective layer on the source electrode and the drain electrode, and the first electrode of the capacitor.

The method may further include an operation of simultaneously forming a pad electrode on a same layer as the source electrode and the drain electrode.

The method may further include an operation of forming a protective layer on the pad electrode.

An uneven pattern may be formed on a surface of the second organic insulating layer.

The pixel electrode may be formed as a transflective electrode, and the opposite electrode may be formed as a reflective electrode.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

As the inventive concept allows for various changes and numerous embodiments, particular embodiments will be illustrated in the drawings and described in detail in the written description. Effects and features of the inventive concept and methods of accomplishing the same may be understood more readily by reference to the following detailed description of embodiments and the accompanying drawings. The inventive concept may, however, be embodied in many different forms and should not be construed as being limited to the embodiments set forth herein.

Hereinafter, one or more embodiments will be described below in more detail with reference to the accompanying drawings. Those components that are the same or are in correspondence are rendered the same reference numeral regardless of the figure number, and redundant explanations are omitted.

Hereinafter, in one or more embodiments, while such terms as "first," "second," etc., may be used, such components must not be limited to the above terms, and the above terms are used only to distinguish one component from another.

Hereinafter, in one or more embodiments, a singular form may include plural forms, unless there is a particular description contrary thereto.

Hereinafter, in one or more embodiments, terms such as "comprise" or "comprising" are used to specify existence of a recited feature or component, not excluding the existence of one or more other recited features or one or more other components.

Hereinafter, in one or more embodiments, it will also be understood that when an element such as layer, region, or component is referred to as being "on" another element, it can be directly on the other element, or intervening elements such as layer, region, or component may also be interposed therebetween.

In the drawings, for convenience of description, the sizes of layers and regions are exaggerated for clarity. For example, a size and thickness of each element may be random for convenience of description, thus, one or more embodiments are not limited thereto.

As used herein, the term "and/or" includes any and all combinations of one or more of the associated listed items.

Figure 1:
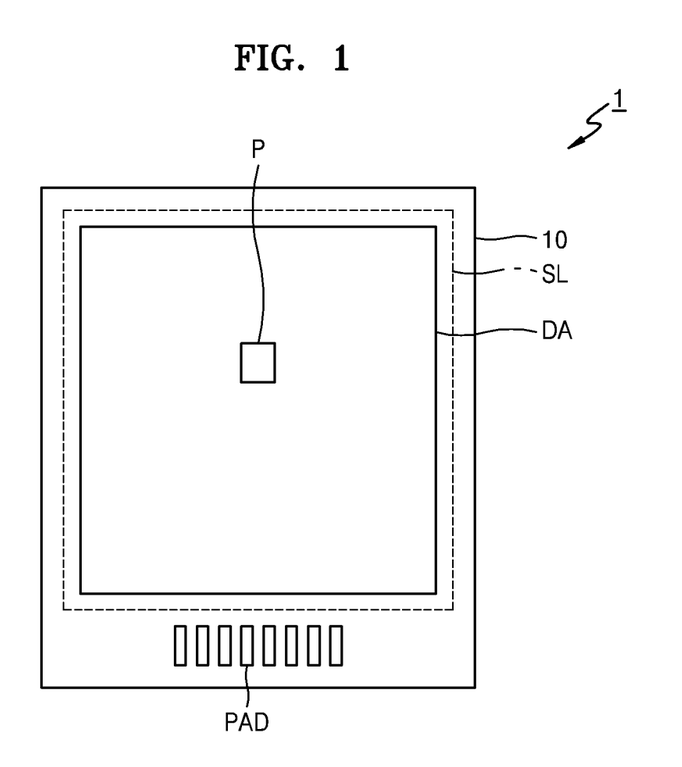
FIG. 1 is a plan view of an organic light-emitting display apparatus according to a first embodiment.
Figure 2:
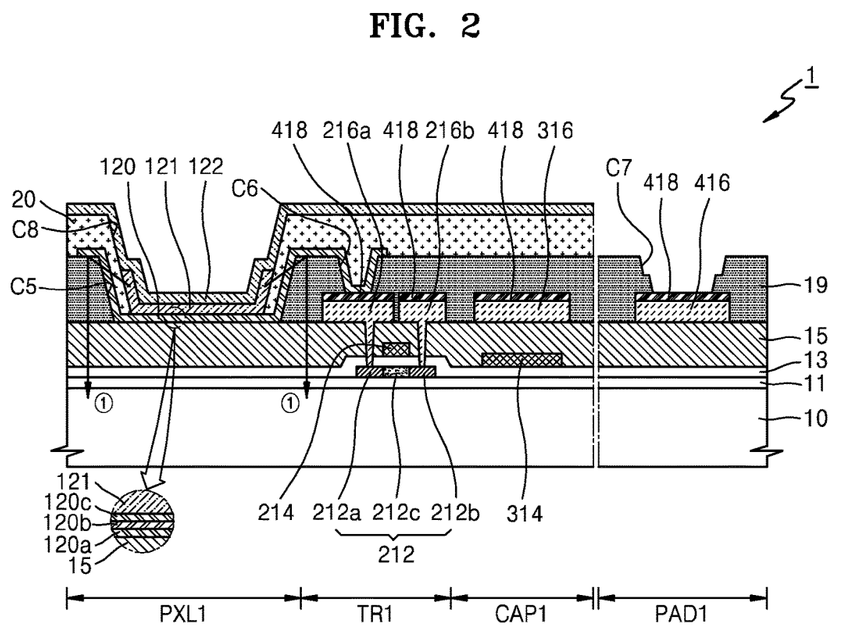
FIG. 2 is a cross-sectional view illustrating a portion of an emission pixel and a portion of a pad of the organic light-emitting display apparatus according to the first embodiment.

FIG. 1 is a plan view of an organic light-emitting display apparatus 1 according to a first embodiment. FIG. 2 is a cross-sectional view illustrating a portion of an emission pixel and a portion of a pad of the organic light-emitting display apparatus 1 according to the first embodiment.

Referring to FIG. 1, the organic light-emitting display apparatus 1 includes a display area DA on a substrate 10, and the display area DA includes a plurality of pixels P and thus displays an image. The display area DA is formed within a sealing line SL when viewed in a viewing direction perpendicular to a major surface of the substrate, and an encapsulation member is arranged to encapsulate the display area DA along the sealing line SL. In embodiments, the bottom surface of the substrate may be the major surface, and the viewing direction may be a thickness direction of the substrate.

In embodiments, the plurality of pixels are arranged to form an array. Referring to FIG. 2, when viewed in the viewing direction, each of the plurality of pixels includes a pixel region PXL1 having at least one light emission layer 121, a thin-film transistor region TR1 having at least one thin-film transistor, and a capacitor region CAP1 having at least one capacitor. The apparatus 1 includes a pad region PAD1.

In the thin-film transistor region TR1, an active layer 212 of the thin-film transistor is arranged above the substrate 10 and a buffer layer 11.

The substrate 10 may be formed as a transparent substrate including a glass substrate or a plastic substrate including polyethylene terephthalate (PET), polyethylene naphthalate (PEN), polyimide, or the like.

The buffer layer 11 may be further arranged on the substrate 10 so as to form a planar surface on the substrate 10 and to avoid or minimize penetration of foreign substances. The buffer layer 11 may be formed as a single layer or multiple layers including silicon nitride and/or silicon oxide.

The active layer 212 is arranged on the buffer layer 11 in the thin-film transistor region TR1. The active layer 212 may be formed of a semiconductor including amorphous silicon or polysilicon. The active layer 212 may include a channel region 212c, and a source region 212a and a drain region 212b that are arranged at both sides of the channel region 212c and are doped with impurity. A material of the active layer 212 is not limited to amorphous silicon or poly silicon and may include an oxide semiconductor.

A gate insulating layer 13 is arranged on the active layer 212 and covers the active layer 212. The gate insulating layer 13 may be formed as a single layer or multiple layers including silicon nitride and/or silicon oxide.

A gate electrode 214 is arranged on the gate insulating layer 13. The gate electrode 214 may be formed as a single layer or multiple layers including at least one metal material selected from aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu).

In embodiments, a wire such as a scan line may be formed on the gate insulation layer 13 and formed of the same material as the gate electrode 214 by forming a layer of the gate electrode material on the gate insulating layer 13 and then patterning the layer to simultaneously form the gate electrode layer and the scan line. Generally, as a size of a screen of the organic light-emitting display apparatus 1 is increased, it is required to increase the thickness of the wire so as to prevent a signal delay due to the large screen. In the present embodiment, a thickness of the gate electrode 214 and the wire may be set between about 6,000 and about 12,000 Å. When the thickness of the gate electrode 214 and the wire is equal to or greater than at least 6,000 Å, the signal delay may be prevented in a large screen of at least 50 inches. Further, it is possible to form the gate electrode 214 and the wiring that have a thickness smaller than about 12,000 Å by way of deposition without difficulties.

An interlayer insulating layer 15 is deposited on the gate insulation layer 13 and covers the gate electrode 214. The interlayer insulating layer 15 may be formed as a single layer or formed to have multiple sub-layers including silicon nitride and/or silicon oxide.

A source electrode 216a and a drain electrode 216b are arranged on the interlayer insulating layer 15. Each of the source electrode 216a and the drain electrode 216b may be formed as a single layer or multiple layers including at least one metal material selected from Al, Pt, Pd, Ag, Mg, Au, Ni, Nd, Ir, Cr, Li, Ca, Mo, Ti, W, Cu, and an alloy thereof.

A protective layer 418 is formed on the source electrode 216a and the drain electrode 216b. The protective layer 418 protects the source electrode 216a and the drain electrode 216b from being exposed to etchant while a pixel electrode 120 is etched, so that a particle defect may be prevented.

Since the protective layer 418 and the source electrode 216a, and the protective layer 418 and the drain electrode 216b are etched by using a same mask, etched surfaces of the protective layer 418 and the source electrode 216a may be placed in substantially the same plane to form a smooth side, and etched surfaces of the protective layer 418 and the drain electrode 216b may be placed in substantially the same plane to form a smooth side.

A first organic insulating layer 19 is formed on the interlayer insulation layer 15 and covers the source electrode 216a and the drain electrode 216b. A second organic insulating layer 20 is formed on the first organic insulating layer 19. The first organic insulating layer 19 and the second organic insulating layer 20 may include polymer derivatives having commercial polymers (PMMA and PS) and a phenol group, an acryl-based polymer, an imide-based polymer, an allyl ether-based polymer, an amide-based polymer, a fluorine-based polymer, a p-xylene-based polymer, a vinyl alcohol-based polymer, or a combination thereof.

The pixel electrode 120 is connected one of the source electrode 216a and the drain electrode 216b via a contact hole C6 formed on the interlayer insulation layer 15 and the first organic insulating layer 19.

In the illustrated embodiments, the pixel electrode 120 is arranged on and contacts the interlayer insulating layer 15 in the pixel region PXL1.

The pixel electrode 120 includes a transflective metal layer 120b. Also, the pixel electrode 120 may further include a first transparent conductive oxide layer 120a and a second transparent conductive oxide layer 120c that are formed below and on the transflective metal layer 120b, respectively.

The transflective metal layer 120b may be formed of Ag or a silver alloy. The transflective metal layer 120b and an opposite electrode 122 that is a reflective electrode to be described later may form a micro-cavity structure and thus may improve a luminescent efficiency of the organic light-emitting display apparatus 1.

Each of the first and second transparent conductive oxide layers 120a and 120c may include at least one material selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). The first transparent conductive oxide layer 120a may reinforce adhesion between the interlayer insulating layer 15 and the transflective metal layer 120b, and the second transparent conductive oxide layer 120c may function as a barrier layer for protecting the transflective metal layer 120b.

A metal material such as silver that is highly reducible, and Particles of the transflective metal layer 120b formed of such metal material, such as silver particles, may be extracted while the pixel electrode 120 is etched. The extracted silver particles may be a main factor of particle defects that may cause dark spots. While the pixel electrode 120 including silver is etched, if the source electrode 216a, the drain electrode 216b, a pad electrode 416, or the wire is exposed to an etchant, silver ions that are highly reducible may receive an electron from the aforementioned metal materials and may be re-extracted as silver particles. However, in the organic light-emitting display apparatus 1 according to the present embodiment, the source electrode 216a, the drain electrode 216b, and the pad electrode 416 are protected by the protective layer 418 and thus are not exposed to the etchant. Therefore, the particle defect due to the re-extraction of the silver particle may be avoided or minimized.

The pixel electrode 120 includes a first portion disposed within a first hole or opening C5 that is formed in an area that does not overlap with elements of the thin-film transistor, such as, the active layer 212 and the gate electrode 214, and elements of a capacitor, such as, capacitor electrodes 314 and 316 to be described later. Edge portions of the pixel electrode 120 are formed on the first organic insulating layer 19 that is outside the first opening C5. As the edge portions of the pixel electrode 120 extend on the first organic insulating layer 19 outside the first opening C5, light that is emitted from the emission layer 121 is partly refracted and/or reflected at an interface between the edge portion of the pixel electrode 120 and the neighboring layer and thus is discharged toward the substrate 10 (refer to ①). Thus, a luminescent efficiency of an organic light-emitting display apparatus such as the organic light-emitting display apparatus 1 according to the present embodiment is improved.

The edge portions of the pixel electrode 120 are covered by the second organic insulating layer 20. A second hole or opening C8 that overlaps with the first opening C5 is formed in the second organic insulating layer 20. In the illustrated embodiments, the second opening C8 has a size smaller than that of the first opening C5.

An intermediate layer that includes the emission layer 121 is arranged on the pixel electrode 120 whose top surface is exposed by the second opening C8 formed in the second organic insulating layer 20. The light emission layer 121 may include a small molecule organic material or a polymer organic material.

When the emission layer 121 includes the small molecule organic material, the intermediate layer may further include a hole transport layer (HTL), a hole injection layer (HIL), an electron transport layer (ETL), or an electron injection layer (EIL). In addition to these layers, in embodiments, the intermediate layer may further include various layers. Here, various organic materials including copper phthalocyanine (CuPc), N,N'-Di(naphthalene-1-yl)-N,N'-diphenyl-benzidine (NPB), tris-8-hydroxyquinoline aluminum)(Alq3), or the like may be used.

When the emission layer 121 includes the polymer organic material, the intermediate layer may further include an HTL. The HTL may be formed of poly-(2,4)-ethylenedihydroxy thiophene (PEDOT) or polyaniline (PANI). Here, the polymer organic material may include poly-phenylene vinylene (PPV), polyfluorene, or the like. Also, an inorganic material may be further arranged between the emission layer 121 and pixel electrode 120 and may be further arranged between the emission layer 121 and the opposite electrode 122.

Referring to FIG. 2, the emission layer 121 is disposed in the second opening C8 but this is only for convenience of description and one or more embodiments are not limited thereto. The emission layer 121 may be formed not only in the second opening C8 but may also extend to a top surface of the second organic insulating layer 20 along an etched surface of the second opening C8 formed in the second organic insulating layer 20.

The opposite electrode 122 is formed on the emission layer 121 and the second organic insulation layer 20. In the organic light-emitting display apparatus 1 according to the present embodiment, the pixel electrode 120 is used as an anode and the opposite electrode 122 is used as a cathode but polarities of electrodes may be switched.

The opposite electrode 122 may be the reflective electrode including a reflective material. The opposite electrode 122 may include at least one material selected from Al, Mg, Li, Ca, LiF/Ca, and LiF/Al. Since the opposite electrode 122 is formed as the reflective electrode, light that is emitted from the emission layer 121 is reflected from the opposite electrode 122 and thus is discharged toward the substrate 10 via the pixel electrode 120 formed of translucent metal.

In embodiments, the opposite electrode 122 is not separately formed in each pixel but is formed as a common electrode that wholly covers the display area DA (refer to FIG. 1).

The micro-cavity structure may cause a color shift of light that is discharged toward the substrate 10. The color shift may be affected from a material and a thickness of the interlayer insulating layer 15. In the present embodiment, an entire thickness of the interlayer insulating layer 15 is about 6000 Å and in this regard, a silicon oxide layer of about 4000 Å of the interlayer insulating layer 15 is formed on the gate insulation layer 13, and a silicon nitride layer of about 2000 Å of the interlayer insulating layer 15 is formed on the silicon oxide layer such that the silicon nitride layer is disposed between the silicon oxide layer and the pixel electrode 120. By doing so, the color shift may be improved, compared to a structure in which a silicon oxide layer of 3000 Å and a silicon nitride layer of 3000 Å are formed as an interlayer insulating layer.

The capacitor region CAP1 has a capacitor including a first electrode 314 disposed on the gate insulation layer 13 as the gate electrode 214 is disposed on the gate insulation layer 13. The capacitor further includes a second electrode 316 disposed on the interlayer insulation layer as the source electrode 216a and the drain electrode 216b are disposed on the interlayer insulation layer. The interlayer insulating layer 15 includes a portion disposed between the first electrode 314 and the second electrode 316.

The first electrode 314 may be formed of a same material as the gate electrode 214.

The protective layer 418 is formed on the second electrode 316. The protective layer 418 protects the second electrode 316 from being exposed to an etchant while the pixel electrode 120 is etched, so that a particle defect may be avoided or minimized.

Since the protective layer 418 and the second electrode 316 are etched by using a same mask, etched surfaces of the protective layer 418 and the second electrode 316 may be placed in substantially the same plane and form a smooth side.

In the pad region PAD1 that is an outer region of the display area DA, the pad electrode 416 that is a connection terminal of an external driver is positioned.

The pad electrode 416 is disposed on the interlayer insulating layer 15, and edges of the pad electrode 416 are covered with the first organic insulating layer 19.

The pad electrode 416 is formed of the same material as the source electrode 216a and the drain electrode 216b, and the protective layer 418 is formed on the pad electrode 416. The protective layer 418 protects the pad electrode 416 from being exposed to an etchant while the pixel electrode 120 is etched, so that a particle defect may be avoided or minimized. Also, the protective layer 418 protects the pad electrode 416 from being exposed to moisture and oxygen, so that it is possible to avoid or minimize reliability deterioration of a pad.

Since the protective layer 418 and the pad electrode 416 are etched by using a same mask, etched surfaces of the protective layer 418 and the pad electrode 416 may be placed in substantially same plane and from a smooth side.

In embodiments, the organic light-emitting display apparatus 1 may further include an encapsulation member that encapsulates the pixel region PXL1, the capacitor region CAP1, and the thin-film transistor region TR1. The encapsulation member may be formed as a substrate including a glass material, a metal film, or an encapsulation thin film formed of an organic insulating film and an inorganic insulating film that are alternately stacked.

Hereinafter, a method of manufacturing the organic light-emitting display apparatus 1 will be described with reference to FIGS. 3A through 3G.

Figure 3A:
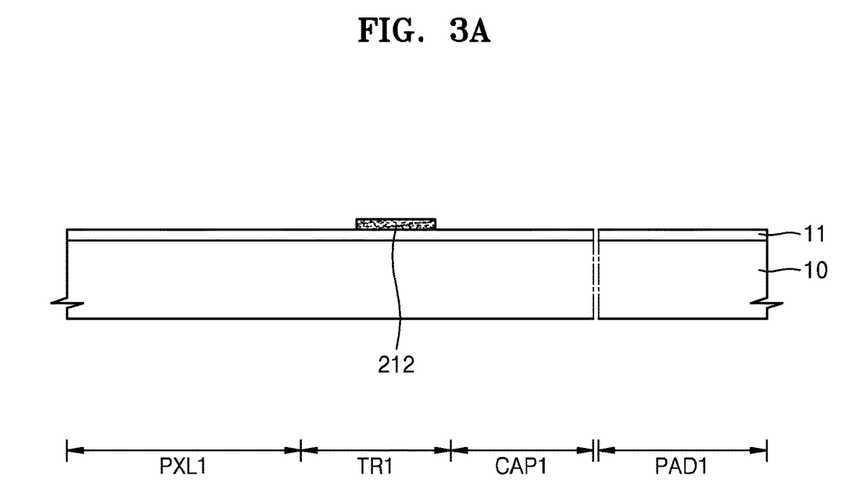
FIGS. 3A through 3G are cross-sectional views illustrating a method of manufacturing the organic light-emitting display apparatus of the first embodiment.

FIG. 3A is a cross-sectional view illustrating a first process for the organic light-emitting display apparatus 1, according to an embodiment.

Referring to FIG. 3A, the buffer layer 11 is formed on the substrate 10, and a semiconductor layer is formed on the buffer layer 11 and then is patterned so as to form the active layer 212 of a thin-film transistor.

In embodiments, after photoresist is coated on the semiconductor layer, the semiconductor layer is patterned via a photolithography process using a first photomask (not shown), so that the active layer 212 is formed. The photolithography process is processed in a manner that the first photomask is exposed by an exposure device (not shown), and then developing, etching, and stripping or ashing processes are sequentially performed.

The semiconductor layer may be formed of amorphous silicon or poly silicon. Here, the poly silicon may be formed by crystallizing the amorphous silicon. The crystallization of the amorphous silicon may be performed by using various methods including a rapid thermal annealing (RTA) method, a solid phase crystallization (SPC) method, an excimer laser annealing (ELA) method, a metal induced crystallization (MIC) method, a metal induced lateral crystallization (MILC) method, a sequential lateral solidification (SLS) method, and the like. However, a method for the semiconductor layer is not limited to the amorphous silicon or the poly silicon and may include an oxide semiconductor.

Figure 3B:
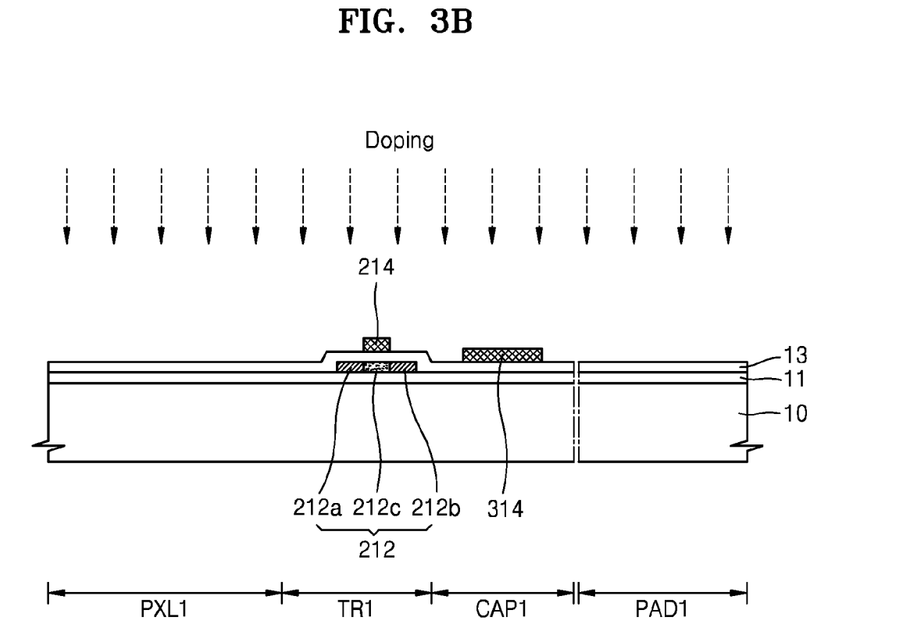

FIG. 3B is a cross-sectional view illustrating a second process for the organic light-emitting display apparatus 1, according to an embodiment.

The gate insulating layer 13 is formed on the resultant of the first process shown in FIG. 3A, and a first metal layer is formed on the gate insulating layer 13 and is patterned. After the first metal layer is stacked on the gate insulating layer 13, the first metal layer is patterned. The first metal layer may be formed as a single layer or multiple layers including at least one metal material selected from Al, Pt, Pd, Ag, Mg, Au, Ni, Nd, Ir, Cr, Li, Ca, Mo, Ti, W, and Cu.

As a result, the gate electrode 214 and the first electrode 314 of the capacitor are formed on the gate insulating layer 13 by patterning.

Ion impurity is doped on the aforementioned structure. The ion impurity including b-type ion or p-type ion may be doped, and in more detail, the ion impurity with a density of at least $1 \times 10^{15}$ atoms/cm$^2$ is doped while targeting the active layer 212 of the thin-film transistor.

The active layer 212 is doped with the ion impurity by using the gate electrode 214 as a self-align mask, so that the active layer 212 has the source region 212a and the drain region 212b, and the channel region 212c therebetween that are doped with the ion impurity.

Figure 3C:
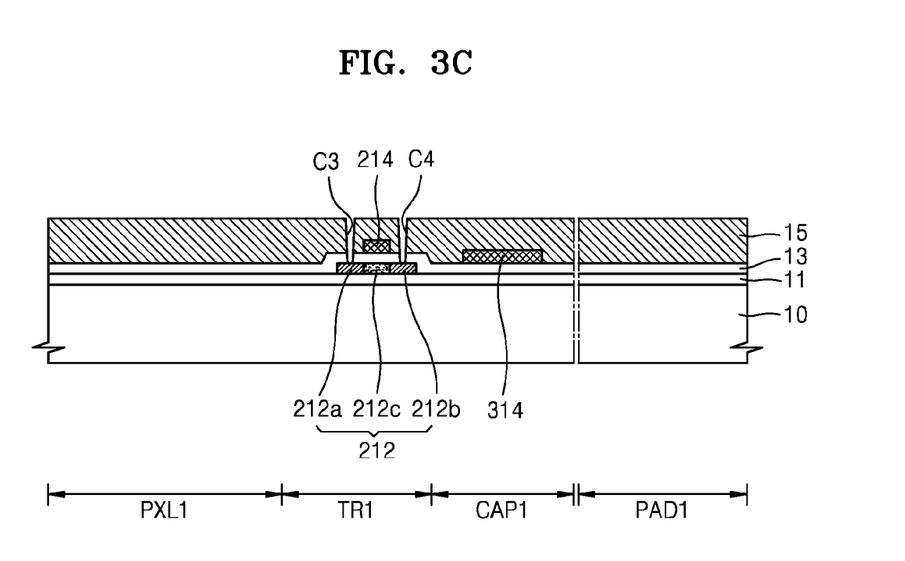

FIG. 3C is a cross-sectional view illustrating a third process for the organic light-emitting display apparatus 1, according to an embodiment.

The interlayer insulating layer 15 is formed on the resultant of the second process shown in FIG. 3B and is patterned so as to form openings C3 and C4 for exposing the source region 212a and the drain region 212b of the active layer 212.

Figure 3D:
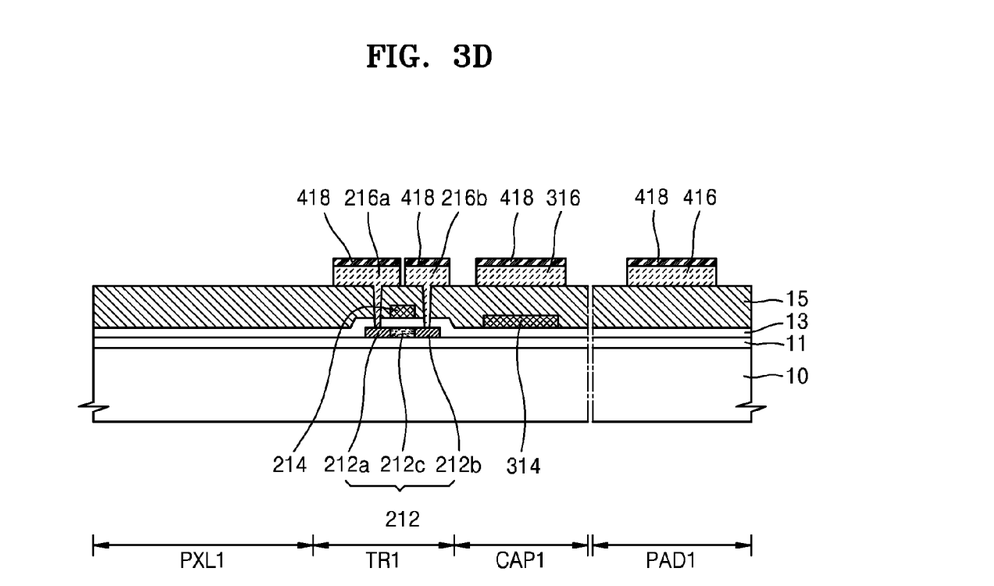

FIG. 3D is a cross-sectional view illustrating a fourth process for the organic light-emitting display apparatus 1, according to an embodiment.

Referring to FIG. 3D, a second metal layer and the protective layer 418 are formed on the resultant of the third process shown in FIG. 3C and are patterned so as to simultaneously form the source electrode 216a and the protective layer 418, the drain electrode 216b and the protective layer 418, the second electrode 316 of the capacitor and the protective layer 418, and the pad electrode 416 and the protective layer 418.

The second metal layer may have at least two different metal sub-layers having different electron mobilities. For example, the second metal layer may be formed of at least two different metal sub-layers including metal materials selected from Al, Pt, Pd, Ag, Mg, Au, Ni, Nd, Ir, Cr, Li, Ca, Mo, Ti, W, Cu, and an alloy thereof.

The protective layer 418 may be formed as a transparent conductive oxide layer including at least one material selected from the group consisting of ITO, IZO, ZnO, In$_2$O$_3$, IGO, and AZO.

Figure 3E:
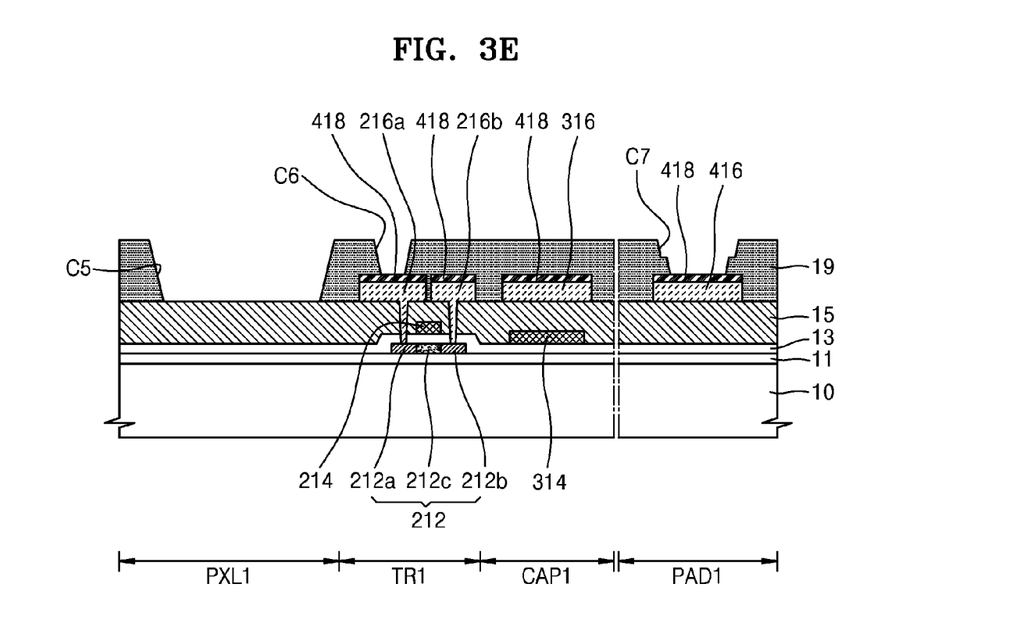

FIG. 3E is a cross-sectional view illustrating a fifth process for the organic light-emitting display apparatus 1, according to an embodiment.

Referring to FIG. 3E, the first organic insulating layer 19 is formed on the resultant of the fourth process shown in FIG. 3D and is patterned, so that the contact hole C6, a contact hole C7 for exposing a top surface of the protective layer 418 on the pad electrode 416, and the first opening C5 in the pixel region PXL1 are formed, wherein the pixel electrode 120 is to be disposed in the pixel region PXL1.

The first opening C5 is formed in an area that does not overlap with the thin-film transistor and the capacitor.

Figure 3F:
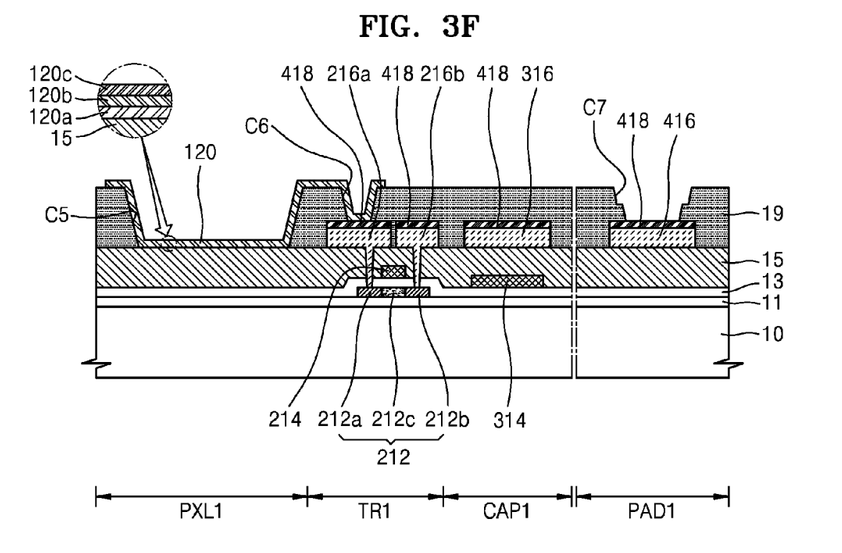

FIG. 3F is a cross-sectional view illustrating a sixth process for the organic light-emitting display apparatus 1, according to an embodiment.

Referring to FIG. 3F, the first transparent conductive oxide layer 120a, the transflective metal layer 120b, and the second transparent conductive oxide layer 120c are deposited and patterned on the resultant of the fifth process shown in FIG. 3E, so that the pixel electrode 120 is formed.

Edge portions of the pixel electrode 120 are formed on the first organic insulating layer 19 and outside the first opening C5. As the edge portions of the pixel electrode 120 extend on the first organic insulating layer 19 outside the first opening C5, light that is emitted from the emission layer 121 is partly refracted and/or reflected at an interface between the edge portion of the pixel electrode 120 and each neighboring layer and thus is discharged toward the substrate 10 (refer to ① of FIG. 2), so that a luminescent efficiency of an organic light-emitting display apparatus such as the organic light-emitting display apparatus 1 according to the present embodiment is improved.

Figure 3G:
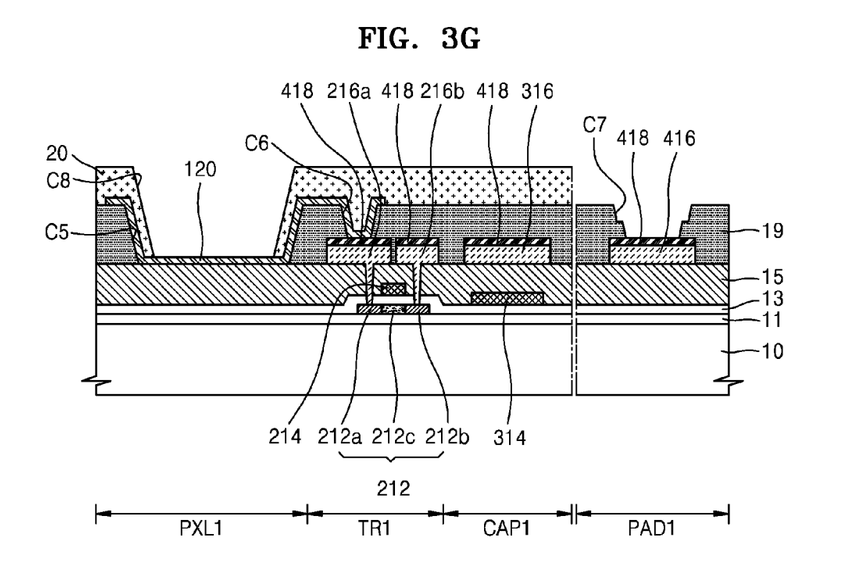

FIG. 3G is a cross-sectional view illustrating a seventh process for the organic light-emitting display apparatus 1, according to an embodiment.

Referring to FIG. 3G, the seventh process is performed to form the second organic insulating layer 20 on the resultant of the sixth process shown in FIG. 3F and then to form the second opening C8 for exposing a top surface of the pixel electrode 120 on the resultant of the sixth process shown in FIG. 3F.

The second organic insulating layer 20 functions as a pixel defining layer and may be formed as an organic insulating layer including polymer derivatives having commercial polymers (PMMA and PS) and a phenol group, an acryl-based polymer, an imide-based polymer, an allyl ether-based polymer, an amide-based polymer, a fluorine-based polymer, a p-xylene-based polymer, a vinyl alcohol-based polymer, or a combination thereof.

An intermediate layer including the emission layer 121 (refer to FIG. 2) is formed on the resultant of the seventh process shown in FIG. 3G, and the opposite electrode 122 (refer to FIG. 2) is formed.

In the organic light-emitting display apparatus 1 according to the first embodiment, the pixel electrode 120 includes the transflective metal layer 120b, so that a luminescent efficiency of the organic light-emitting display apparatus 1 may be improved due to a micro-cavity structure.

Also, since the first organic insulating layer 19 covers the source electrode 216a or the drain electrode 216b, so that the source electrode 216a or the drain electrode 216b is not exposed to the etchant including silver ion, thus, the particle defect due to re-extraction of silver may be prevented.

Also, since the organic light-emitting display apparatus 1 is manufactured through the seven mask processes, the manufacturing costs may be reduced.

Figure 4:
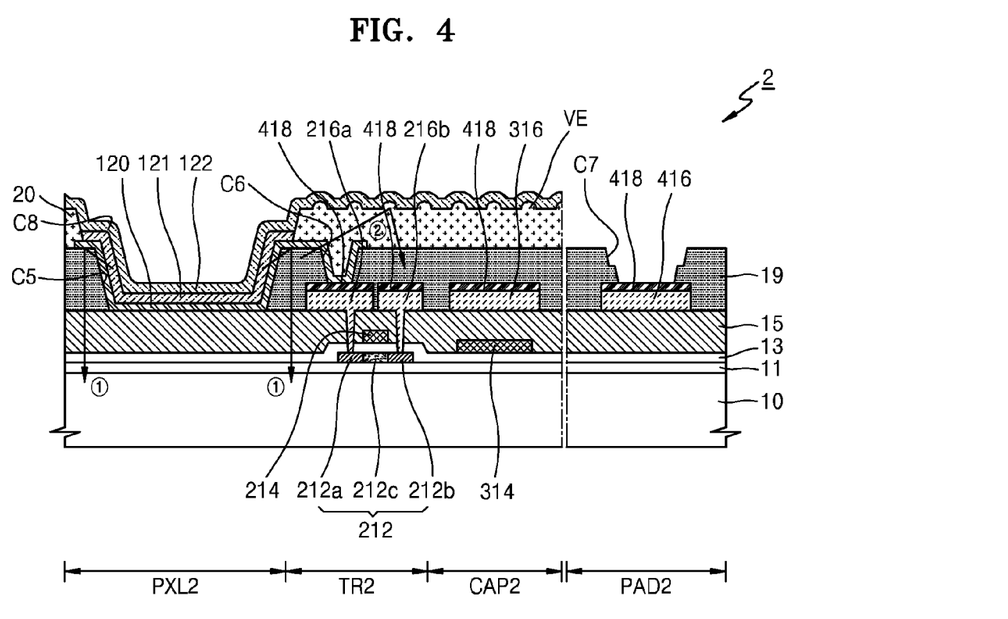
FIG. 4 is a cross-sectional view illustrating a portion of an emission pixel and a portion of a pad of an organic light-emitting display apparatus, according to a second embodiment.

FIG. 4 is a cross-sectional view illustrating a portion of an emission pixel and a portion of a pad of an organic light-emitting display apparatus 2, according to a second embodiment.

Referring to FIG. 4, each of the array of pixels includes a pixel region PXL2 having at least one emission layer 121, a thin-film transistor region TR2 having at least one thin-film transistor, and a capacitor region CAP2 having at least one capacitor. The apparatus 2 further includes a pad region PAD2.

Hereinafter, the organic light-emitting display apparatus 2 according to the present embodiment is described with reference to differences from the organic light-emitting display apparatus 1 according to the first embodiment.

In the present embodiment, the pixel region PXL2, the thin-film transistor region TR2, the pad region PAD2, and the capacitor region CAP2 are same as the first embodiment, and a shape of the second organic insulating layer 20 is different from the first embodiment.

An uneven surface VE is formed on the top of the second organic insulating layer 20. The opposite electrode is formed on the uneven surface of the second organic insulating layer 20, and thus, the opposite electrode includes an uneven surface. The uneven surface of the opposite electrode scatters a portion of light that is emitted from the emission layer 121 and is reflected from the opposite electrode 122 (refer to ②). The scattering may decrease a color shift of light, which is discharged toward the substrate 10, due to a micro-cavity structure.

As described above, the one or more of the above embodiments provide the organic light-emitting display apparatus having an improved display quality, and the method of manufacturing the organic light-emitting display apparatus with reduced manufacturing costs.

It should be understood that the embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. An organic light-emitting display apparatus comprising:
    a substrate comprising a major surface;
    an active layer formed over the substrate;
    a gate insulating layer formed over the active layer;
    a gate electrode formed over the gate insulating layer for a thin-film transistor comprising the gate electrode and the active layer;
    a first capacitor electrode formed over the gate insulating layer and formed of the same material as that of the gate electrode;
    an interlayer insulating layer formed over the gate electrode and the first capacitor electrode;
    a source electrode and a drain electrode formed over the interlayer insulating layer;
    a second capacitor electrode formed over the interlayer insulating layer and formed of the same material as that of the source electrode and the drain electrode for providing a capacitor comprising the first and second capacitor electrodes;
    a first organic insulating layer covering the source electrode, the drain electrode, and the second capacitor electrode, the first organic insulating layer comprising a first hole that does not overlap with any of the active layer, the gate electrode and the first and second capacitor electrodes when viewed in a viewing direction perpendicular to the major surface;
    a pixel electrode formed over the interlayer insulating layer and the first organic insulating layer, the pixel electrode comprising a first portion disposed inside the first hole and a second portion disposed over the first organic insulating layer and outside the first hole, wherein the first portion is disposed directly on the interlayer insulating layer and the second portion is disposed directly on the first organic insulating layer;
    a second organic insulating layer formed over the first organic insulating layer and comprising a second hole that overlaps with the first hole when viewed in the viewing direction, the second organic insulating layer covering edges of the pixel electrode;
    a light emission layer formed over the pixel electrode; and
    an opposite electrode formed over the light emission layer.

2. The organic light-emitting display apparatus of claim 1, wherein the pixel electrode comprises a first transparent conductive oxide layer, a transflective metal layer, and a second transparent conductive oxide layer that are sequentially stacked.

3. The organic light-emitting display apparatus of claim 2, wherein each of the first and second transparent conductive oxide layers comprises at least one material selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

4. The organic light-emitting display apparatus of claim 2, wherein the transflective metal layer comprises silver (Ag) or a silver alloy.

5. The organic light-emitting display apparatus of claim 1, wherein the first hole has a size greater than that of the second opening-hole when viewed in the viewing direction.

6. The organic light-emitting display apparatus of claim 1, wherein a bottom surface of the pixel electrode contacts a top surface of the interlayer insulating layer.

7. The organic light-emitting display apparatus of claim 1, wherein the interlayer insulating layer comprises a silicon oxide sub-layer and a silicon nitride sub-layers that are sequentially stacked over the substrate.

8. The organic light-emitting display apparatus of claim 7, wherein the silicon oxide sub-layer has a thickness substantially twice as that of the silicon nitride sub-layer.

9. The organic light-emitting display apparatus of claim 1, further comprising a protective layer disposed over each of the source electrode, the drain electrode, and the second capacitor electrode.

10. The organic light-emitting display apparatus of claim 1, wherein the light emission layer comprises a portion overlapping the second portion of the pixel electrode when viewed in the viewing direction.

11. The organic light-emitting display apparatus of claim 1, further comprising a pad electrode disposed over the interlayer insulating layer and formed of the same material as the source electrode and the drain electrode, wherein the pad electrode comprises a portion that does not overlap the first and second organic insulating layer when viewed in the viewing direction.

12. The organic light-emitting display apparatus of claim 11, further comprising a protective layer disposed over the pad electrode.

13. The organic light-emitting display apparatus of claim 1, wherein the opposite electrode comprises an uneven surface placed over the second organic insulating layer and configured to scatter light reaching thereto.

14. The organic light-emitting display apparatus of claim 1, further comprising first, second and third protective layer portions respectively disposed over the source electrode, the drain electrode, and the second capacitor electrode, wherein the protective layer portions have respectively the same width as those of the source electrode, the drain electrode, and the second capacitor electrode.

15. A method of manufacturing an organic light-emitting display apparatus, the method comprising:
- forming an active layer over a substrate;
- forming a gate electrode and a first capacitor electrode over a gate insulating layer formed over the substrate, the gate electrode comprising a portion disposed between the active layer and the gate electrode for providing a thin-film transistor;
- forming a source electrode, a drain electrode, and a second capacitor electrode over an interlayer insulating layer formed over the gate insulating layer, the interlayer insulating layer comprising a portion disposed between the first and second capacitor electrodes for providing a capacitor;
- forming a first organic insulating layer over the interlayer insulating layer, the source electrode and the drain electrode so as to cover the source electrode and the drain electrode, the first organic insulating layer comprising a first hole in an area that does not overlap with any of the active layer, the gate electrode and the first and second capacitor electrodes when viewed in a viewing direction perpendicular to a major surface of the substrate;
- forming a pixel electrode over the interlayer insulating layer and the first organic insulating layer, the pixel electrode comprising a first portion disposed inside the first hole and a second portion disposed over the first organic insulating layer and outside the first hole, wherein the first portion is disposed directly on the interlayer insulating layer and the second portion is disposed directly on the first organic insulating layer;
- forming a second organic insulating layer over the first organic insulating layer, the second organic insulating layer covering edges of the pixel electrode;
- forming a light emission layer over the pixel electrode; and
- forming an opposite electrode over the light emission layer.

16. The method of claim 15, wherein forming the gate electrode and the first capacitor electrode comprises:
- forming an electrically conductive material layer over the gate insulating layer; and
- patterning the electrically conductive material layer, thereby forming the gate electrode and the first capacitor electrode with the same electrically conductive material.

17. The method of claim 15, wherein forming the source electrode, the drain electrode, and the second capacitor electrode comprises:
- forming an electrically conductive material layer over the interlayer insulating layer; and
- patterning the electrically conductive material layer, thereby forming the source electrode, the drain electrode, and the second capacitor electrode with the same electrically conductive material.

18. The method of claim 17, wherein patterning the electrically conductive material layer further forms a pad electrode of the electrically conductive material.

19. A method of manufacturing an organic light-emitting display apparatus, the method comprising:
- forming an active layer over a substrate;
- forming a gate electrode and a first capacitor electrode over a gate insulating layer formed over the substrate, the gate electrode comprising a portion disposed between the active layer and the gate electrode for providing a thin-film transistor;
- forming a source electrode, a drain electrode, and a second capacitor electrode over an interlayer insulating layer formed over the gate insulating layer, the interlayer insulating layer comprising a portion disposed between the first and second capacitor electrodes for providing a capacitor;
- forming a first organic insulating layer over the interlayer insulating layer, the source electrode and the drain electrode so as to cover the source electrode and the drain electrode, the first organic insulating layer comprising a first hole in an area that does not overlap with any of the active layer, the gate electrode and the first and second capacitor electrodes when viewed in a viewing direction perpendicular to a major surface of the substrate;
- forming a pixel electrode over the interlayer insulating layer and the first organic insulating layer, the pixel electrode comprising a first portion disposed inside the first hole and a second portion disposed over the first organic insulating layer and outside the first hole;
- forming a second organic insulating layer over the first organic insulating layer, the second organic insulating layer covering edges of the pixel electrode;
- forming a light emission layer over the pixel electrode; and
- forming an opposite electrode over the light emission layer,
- wherein forming the source electrode, the drain electrode, and the second capacitor electrode comprises:
  - forming an electrically conductive material layer over the interlayer insulating layer; and
  - patterning the electrically conductive material layer, thereby forming the source electrode, the drain electrode, and the second capacitor electrode with the same electrically conductive material,
- wherein forming the source electrode, the drain electrode, and the second capacitor electrode further comprises forming a protective layer over the electrically conductive material layer, wherein a protective layer portion disposed over each of the source electrode and the drain electrode, and the first capacitor electrode is formed by patterning the protective layer and the electrically conductive material layer.

* * * * *